United States Patent [19]
Taft et al.

[11] Patent Number: 5,504,363
[45] Date of Patent: Apr. 2, 1996

[54] SEMICONDUCTOR DEVICE

[75] Inventors: Robert C. Taft; James D. Hayden, both of Austin, Tex.

[73] Assignee: Motorola Inc., Schaumburg, Ill.

[21] Appl. No.: 939,342

[22] Filed: Sep. 2, 1992

[51] Int. Cl.$^6$ .................. H01L 29/76; H01L 27/082; H01L 29/00
[52] U.S. Cl. .................. 257/370; 257/557; 257/588; 257/371
[58] Field of Search .................. 257/565, 557, 257/539, 540, 370, 577, 371, 369, 536, 537

[56] References Cited

U.S. PATENT DOCUMENTS

| | | | |
|---|---|---|---|
| 3,654,530 | 4/1972 | Lloyd | 257/542 |
| 3,802,968 | 4/1974 | Ghosh et al. | 148/175 |
| 3,810,123 | 5/1974 | Baitinger et al. | 257/539 |
| 3,892,596 | 7/1975 | Bjorklund et al. | 257/539 |
| 4,247,343 | 1/1981 | Kruzhanov et al. | 257/557 |
| 4,272,776 | 6/1981 | Weigland et al. | 257/511 |
| 4,868,135 | 9/1989 | Ogura et al. | 257/370 |
| 5,045,483 | 9/1991 | Delong et al. | 437/31 |
| 5,218,228 | 6/1993 | Williams et al. | 257/577 |
| 5,227,654 | 7/1993 | Momose et al. | 257/370 |

FOREIGN PATENT DOCUMENTS

| | | | |
|---|---|---|---|
| 56-74959 | 6/1981 | Japan | 257/539 |
| 3-87059 | 4/1991 | Japan | 257/370 |

OTHER PUBLICATIONS

S. Konaka et al., "A 20-ps Si Bipolar IC Using Advanced Super Self-Aligned Process Technology with Collector Ion Implantation," IEEE Trans. Electron Devices, vol. 36, No. 7. Jul. 1989, pp. 1370-1375.

J. Bruchez et al., "The Philosophy of a Simple Collector Diffusion Isolation process," Solid State Technology, Aug. 1987, pp. 93-97.

W. T. Tsang, Semiconductor and Semimetals vol. 22, Academic Press, New York, 1985, chapter 1, pp. 143-172.

C. Kirkman, "A Gate Array Technology For 100MHz Digital ASIC Systems," New Electronics, Apr. 1987, pp. 28 and 30.

S. M. Sze; "Semiconductor Devices Physics and Technology"; 1985; pp. 110-111.

Nakashiba et al. "An advanced PSA Technology for high speed bipolar LSI"; Aug. 1980; pp. 1390-1393. IEEE transactions on electron devices; vol. ED-27, No. 8.

*Primary Examiner*—Wael M. Fahmy
*Attorney, Agent, or Firm*—Kent J. Cooper

[57] ABSTRACT

Vertically stacked regions of n-type and p-type conductivity are formed around bipolar and field effect transistors to reduce parasitic capacitance between the semiconductor device and surrounding well regions. Under reverse bias a portion of the vertically stacked region is fully depleted and thus reduces the parasitic capacitance between the semiconductor device and the well region.

38 Claims, 2 Drawing Sheets

5,504,363

SEMICONDUCTOR DEVICE

FIELD OF THE INVENTION

This invention relates generally to semiconductor devices, and more specifically to a semiconductor device having reduced capacitance and a process for the formation thereof.

BACKGROUND OF THE INVENTION

The semiconductor industry is continually striving to fabricate integrated circuits with ever increasing performance and higher packing densities. Traditionally, the semiconductor industry has simultaneously met both the performance and the packing density requirements by reducing the feature size of semiconductor devices. As the feature size of semiconductor devices continues to be reduced, however, gains in integrated circuit performance, that are normally associated with a reduction in device feature size, are less than expected. This occurs because as device dimensions are reduced other effects, such as parasitic capacitance, are no longer negligible and increases in integrated circuit performance, resulting from a reduction in device feature size, are limited by parasitic capacitance. Therefore, the parasitic capacitance associated with semiconductor devices must be minimized in order to achieve integrated circuits with improved performance. Accordingly, a need exists for semiconductor devices with reduced parasitic capacitance.

SUMMARY OF THE INVENTION

The previously mentioned problems with existing semiconductor devices are overcome by the present invention. In one embodiment of the invention, an integrated circuit is formed. The integrated circuit has a substrate that has a semiconductor device formed therein. The integrated circuit has a doped region formed within the substrate that is laterally offset from the semiconductor device. The integrated circuit has at least three vertically stacked regions of alternating conductivity type formed in the substrate that lie between the semiconductor device and the doped region.

These and other features, and advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

Figure 1:
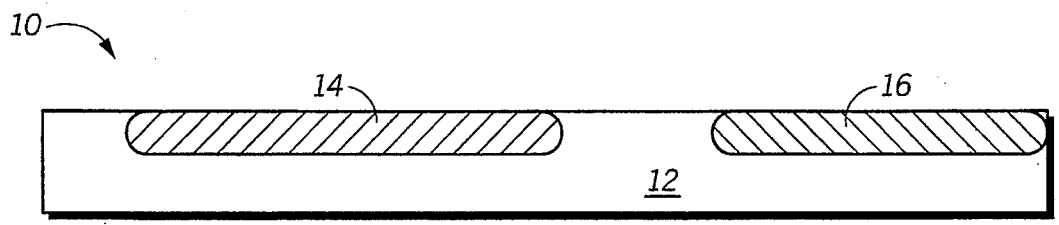
FIGS. 1–7 illustrate, in cross-section, process steps in accordance with one embodiment of the invention.

FIGS. 1 through 7 illustrate, in cross-section, process steps in accordance with one embodiment of the invention wherein a semiconductor device is formed. Shown in FIG. 1 is a portion 10 of an integrated circuit structure comprising a silicon substrate 12, a first buried layer 14, and a second buried layer 16. Silicon substrate 12 preferably has p-type conductivity and is lightly doped with boron. First buried layer 14 and second buried layer 16 are formed using conventional doping techniques such as ion implantation or diffusion. In the preferred embodiment first buried layer 14 has n-type conductivity and is doped with arsenic and second buried layer 16, which is laterally offset from first buried layer 14, has p-type conductivity and is doped with boron.

Figure 2:
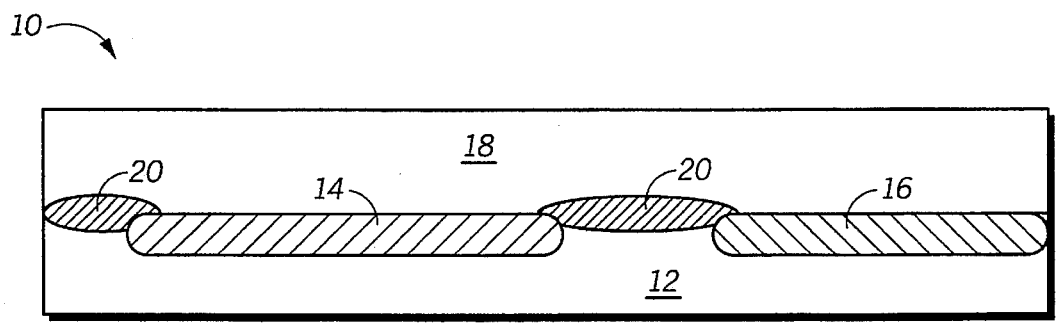

Using conventional processing techniques an epitaxial layer of silicon is then deposited over silicon substrate 12. During the epitaxial deposition process a doped region 20 having n-type conductivity is formed between first buried layer 14 and second buried layer 16, as shown in FIG. 2. This occurs because some of the dopants lying within first buried layer 14 become volatile during the epitaxial silicon deposition process and dope regions surrounding first buried layer 14. The mechanism by which this occurs is known as autodoping. Doped region 20 is lightly doped and has a lower doping concentration than first buried layer 14. Alternatively, doped region 20 may also be formed using conventional ion implantation techniques prior to the deposition of the epitaxial layer of silicon. After deposition, the epitaxial layer of silicon is then doped using conventional doping techniques. This forms a doped region 18 that overlies silicon substrate 12. Doped region 18 has p-type conductivity and is preferably lightly doped with boron. Alternatively, doped region 18 may also be formed using an insitu-doped epitaxial silicon deposition process. Although not shown in FIG. 2, first buried layer 14 and second buried layer 16 may also extend into the deposited epitaxial layer due to dopant diffusion.

Figure 3:
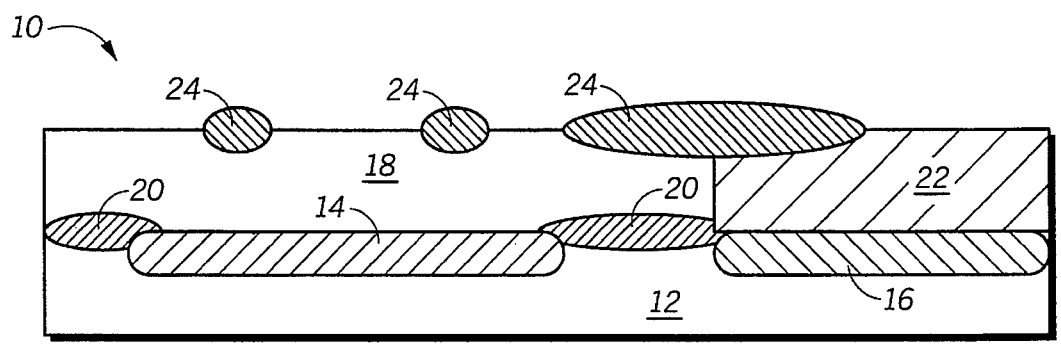

Using conventional doping techniques a well region 22 is then formed within a portion of doped region 18. Well region 22 is also laterally offset from first buried layer 14, as shown in FIG. 3. Well region 22 has p-type conductivity and is preferably doped with boron. A conventional isolation process such as LOCOS is then used to form field isolation 24.

Figure 4:
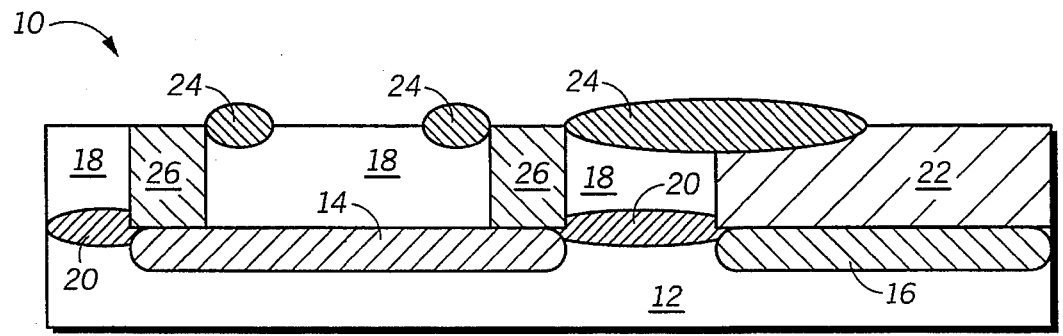

Following the formation of field isolation 24 the process continues with the formation of an n-type conductivity collector contact region 26. Collector contact region 26 extends through doped region 18 and is electrically coupled to first buried layer 14, as shown in FIG. 4. In the preferred embodiment collector contact region 26 overlies the entire perimeter of first buried layer 14. Collector contact region 26 is formed using conventional doping techniques and is preferably doped with phosphorous.

Figure 5:
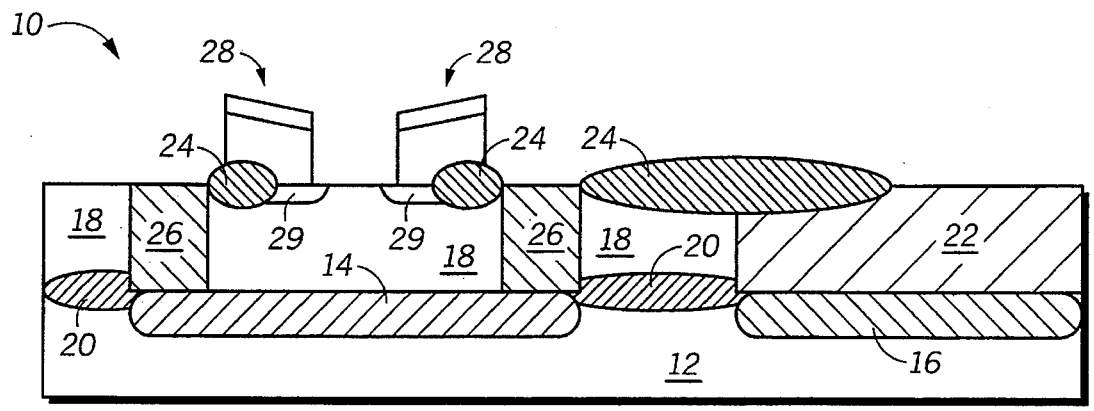

An extrinsic base region 28 is then formed overlying a portion of silicon substrate 12, as shown in FIG. 5. Extrinsic base region 28 is formed using conventional bipolar processing techniques and is preferably a laminate of p-type polysilicon and silicon dioxide. In the preferred embodiment, dopant from the p-type polysilicon is diffused into a portion of the underlying doped region 18 in order to form an extrinsic base link 29.

Figure 6:
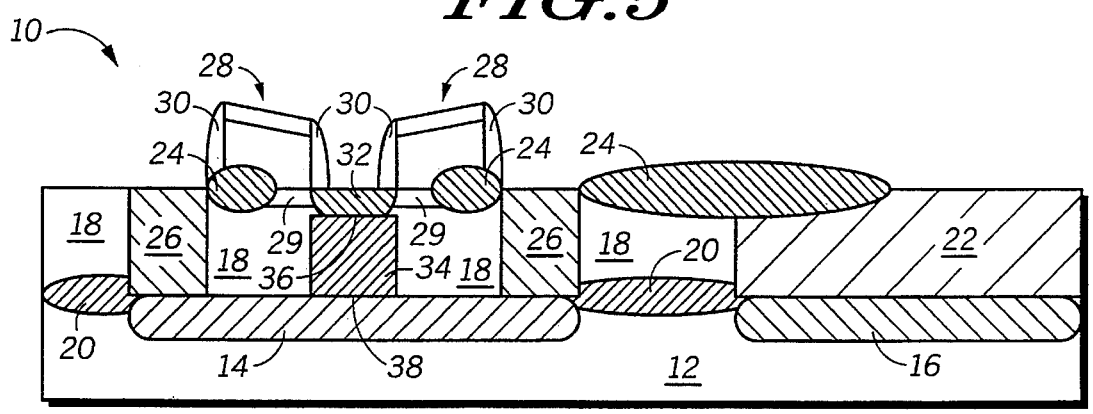

The process continues with the formation of a dielectric sidewall spacer 30 adjacent to the sidewall of extrinsic base region 28. Dielectric sidewall spacer 30 is formed using conventional sidewall spacer formation techniques. Using conventional doping techniques, intrinsic base region 32 and collector region 34 are then formed within a portion of doped region 18. Alternatively, intrinsic base region 32 and collector region 34 may also be formed prior to the formation of sidewall spacer 30. Intrinsic base region 32 has p-type conductivity and is preferably doped with boron. Collector region 34 has n-type conductivity and is preferably doped with phosphorous. The top surface 36 of collector region 34 abuts base region 32 and the bottom surface 38 of collector region 34 abuts first buried layer 14, as shown in FIG. 6.

Using conventional doping techniques an optional resistor 40 is then formed within a portion of doped region 18.

Figure 7:
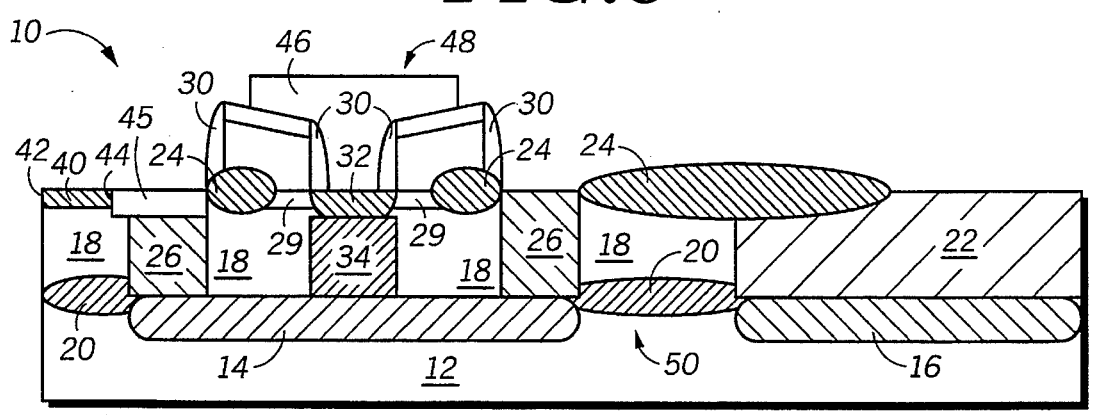

Resistor 40 overlies a portion of doped region 20 and has a first terminal 42 and a second terminal 44. Second terminal 44 is in intimate contact with a top portion 45 of collector contact region 26, as shown in FIG. 7. The doping concentration of top portion 45 is increased using conventional ion implantation techniques in order to insure that second terminal 44 is in intimate contact with top portion 45 of collector contact region 26. Top portion 45 is preferably implanted prior to the formation of resistor 40 and may extend beyond collector contact region 26. Resistor 40 has n-type conductivity and is preferably doped with arsenic. Alternatively, resistor 40 may be formed in an n-type polysilicon layer overlying a portion of doped region 18. Naturally, for a pnp bipolar transistor the resistor would have p-type conductivity. An emitter region 46 is then formed using conventional bipolar processing techniques. Emitter region 46 has n-type conductivity and is preferably polysilicon. As shown in FIG. 7, the resulting npn bipolar transistor 48 is laterally offset from well region 22 and second buried layer 16. In addition, three vertically stacked regions 50 of alternating conductivity type lie between bipolar transistor 48 and well region 22 and second buried layer 16. Vertically stacked regions 50 are used to reduce the parasitic capacitance of bipolar transistor 48. In the preferred embodiment vertically stacked regions 50 surround bipolar transistor 48.

Figure 8:
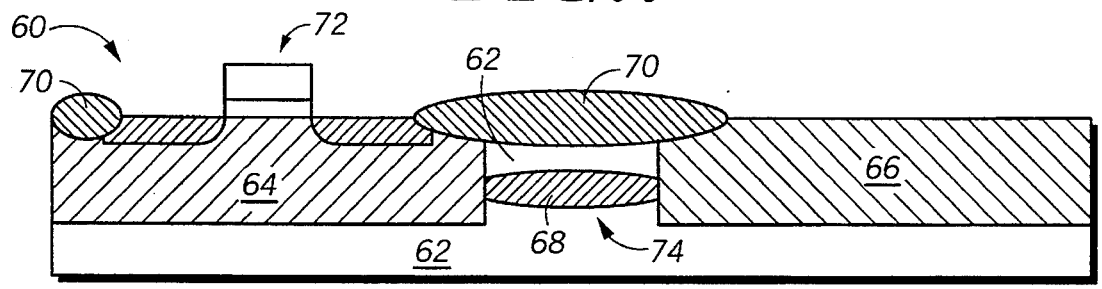
FIG. 8 illustrates, in cross-section, a second embodiment of the invention.

Analogously, vertically stacked regions of alternating conductivity type can also be used to reduce the parasitic capacitance of other semiconductor devices. Shown in FIG. 8 is a portion 60 of an integrated circuit structure comprising a silicon substrate 62 analogous to silicon substrate 12 in FIG. 7, a first well region 64 analogous to first buried layer 14 in FIG. 7, a second well region 66 analogous to second buried layer 16 in FIG. 7, a doped region 68 analogous to doped region 20 in FIG. 7, field isolation 70 analogous to field isolation 24 in FIG. 7, a field effect transistor 72 analogous to bipolar transistor 48 in FIG. 7, and vertically stacked regions 74 analogous to vertically stacked regions 50 in FIG. 7. First well region 64 and second well region 66 are formed using conventional doping techniques similar to those used to form first buried layer 14 and second buried layer 16 in FIG. 7. Doped region 68, however, is preferably formed by conventional ion implantation whereas doped region 20, is preferably formed by the auto-doping mechanism discussed earlier. The ion implantation energy is chosen such that doped region 68 is placed at an appropriate depth below the surface of substrate 62 resulting in the formation of three vertically stacked regions 74 of alternating conductivity type. In contrast to vertically stacked regions 50 in FIG. 7, the conductivity region overlying doped region 68 is not a portion of an epitaxial layer but is a portion of substrate 62, and thus has the same conductivity as substrate 62. Additionally, the implantation dose is chosen such that the doping concentration of doped region 68 is much lower than the doping concentrations of either first well region 64 or second well region 66. Therefore, doped region 68 may be formed either before or after the formation of the well regions without the use of an additional masking step because the doping concentration of doped region 68 will not deleteriously effect the doping profiles of either of the well regions. Additionally, the implantation process results in doped region 68 being self-aligned to both of the well regions. After first well region 64, second well region 66, and doped region 68 are formed, a conventional isolation process such as LOCOS is then used to form field isolation 70. Conventional processing techniques are then used to form field effect transistor 72.

The foregoing description and illustrations contained herein demonstrate many of the advantages associated with the present invention. Formation of the bipolar device in a p-well allows one end of the n-type resistor to be directly merged or contacted to the collector contact. Therefore, the area occupied by the resistor and the bipolar transistor is minimized. Additionally, since the resistor is directly contacting the collector contact the parasitic capacitance associated with this node is reduced because additional metal layers are not required to connect the resistor to the bipolar transistor. Moreover, the parasitic capacitance of the bipolar device is minimized by placing vertically stacked regions, of alternating conductivity type, between the bipolar transistor and the offset p-type conductivity region or regions that border the bipolar transistor. As shown in FIG. 7, doped region 20 contacts first buried layer 14, of bipolar transistor 48, and second buried layer 16 and well region 22. Under reverse bias, doped region 20 is fully depleted because of its light doping concentration and the parasitic capacitance between bipolar transistor 48 and well region 22, and second buried layer 16 is minimized. Naturally, the reduction in parasitic capacitance is greatest when the dopant concentrations of the stacked regions are optimized for the intended operating bias. Additionally, these advantages are obtained without adding additional masking steps to the fabrication process. Furthermore, since collector region 34 abuts first buried layer 14 and intrinsic base region 32, the collector resistance of the bipolar transistor is minimized and thus the performance of the bipolar transistor is enhanced. Moreover, the technique of using vertically stacked regions of alternating conductivity type to reduce parasitic capacitance can also be applied to other semiconductor devices such as field effect transistors.

Thus it is apparent that there has been provided, in accordance with the invention, a semiconductor device that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, three vertically stacked regions of alternating conductivity type were used to reduce the parasitic capacitance of semiconductor devices, but more than three vertically stacked regions of alternating conductivity type could also have been used to reduce the parasitic capacitance of semiconductor devices. Additionally, although a npn bipolar transistor was described in FIGS. 1–7, a pnp bipolar transistor could also be fabricated in a similar manner by making the appropriate changes in conductivity type. Similarly, although a p-type field effect transistor was fabricated in FIG. 8, an n-type field effect transistor could also have been fabricated by making the appropriate changes in conductivity type. Furthermore, although field effect transistor 72 is shown to be formed within well region 64, it could also have been formed within well region 66. Additionally, a semiconductor device could also have been fabricated within well region 66 in addition to field effect transistor 72 in well region 64. Furthermore, it is envisioned that the parasitic capacitance of other semiconductor devices such as diodes, resistors, capacitors, vertical transistor structures, et cetera could also be reduced using processes similar to those described for the bipolar transistor or the field effect transistor. Furthermore, the invention is not limited to single crystal silicon substrates. Other substrates could such gallium arsenide, indium phosphide, silicon on insulator, germanium, et cetera, could be used. Therefore, it is intended that this invention encompass all such variations and modifications as fall within the scope of the appended claims.

We claim:

1. An integrated circuit comprising:
   a substrate of a first conductivity type;
   a first buried layer of a second conductivity type lying within a first portion of the substrate;
   a first doped region of the first conductivity type laterally offset from the first buried layer;
   a second doped region of the second conductivity type lying in between the first buried layer and the first doped region, the second doped region abutting the first buried layer and the first doped region; and
   an epitaxial silicon layer of the first conductivity type overlying the second doped region and the first buried layer.

2. The integrated circuit of claim 1 further comprising a bipolar transistor having a collector contact region, wherein the collector contact region extends through a portion of the epitaxial silicon layer and abuts the first buried layer.

3. The integrated circuit of claim 1 wherein the first doped region comprises a second buried layer lying within a second portion of the substrate.

4. The integrated circuit of claim 1 wherein the first doped region comprises a well region.

5. The integrated circuit of claim 3 wherein the first doped region further comprises a well region overlying the second buried layer.

6. The integrated circuit of claim 2 further comprising:
   a resistor having a first terminal and a second terminal wherein the second terminal of the resistor abuts a portion of the collector contact region.

7. The integrated circuit of claim 2 wherein the bipolar transistor is further characterized as a npn bipolar transistor.

8. A semiconductor device comprising:
   a substrate of a first conductivity type;
   a first buried layer of a second conductivity type lying within the substrate;
   a first region of the first conductivity type laterally offset from the first buried layer;
   a second region of the second conductivity type lying between the first buried layer and the first region;
   a third region of the first conductivity type overlying the first buried layer and the second region;
   a base region of the first conductivity type lying within a portion of the third region;
   an emitter region overlying the base region; and
   a collector contact region extending through the third region and electrically coupled to the first buried layer.

9. The semiconductor device of claim 8 further comprising:
   a resistor, the resistor having a first terminal and a second terminal wherein the second terminal of the resistor abuts a portion of the collector contact region.

10. The semiconductor device of claim 8 wherein the first region comprises a second buried layer.

11. The semiconductor device of claim 8 wherein the first region comprises a well region.

12. The semiconductor device of claim 11 wherein the first region further comprises a second buried layer under the well region.

13. The semiconductor device of claim 8 wherein the second region is further characterized as abutting both the first buried layer and the first region.

14. The semiconductor device of claim 8 further comprising:
    a collector region of the second conductivity type lying within the third region, the collector region having a top surface and a bottom surface wherein the top surface abuts the base region and the bottom surface abuts the first buried layer.

15. The semiconductor device of claim 8, wherein the substrate is further characterized as having a p-type conductivity.

16. The semiconductor device of claim 8, wherein the first buried layer is further characterized as having a n-type conductivity.

17. The semiconductor device of claim 8, wherein the emitter region is further characterized as a polysilicon emitter.

18. The semiconductor device of claim 8 further comprising:
    a resistor lying within a portion of the third region and abutting a portion of the collector contact region.

19. A semiconductor device comprising:
    a substrate of a first conductivity type;
    a buried layer of a second conductivity type lying within the substrate;
    a doped region of the first conductivity type overlying the substrate;
    a base region lying within a portion of the doped region;
    a collector region of the second conductivity type lying within the doped region, the collector region having a top surface and a bottom surface wherein the top surface abuts the base region and the bottom surface abuts the buried layer;
    an emitter region overlying the base region;
    a collector contact region extending through the doped region and electrically coupled to the buried layer; and
    a resistor lying within a portion of the doped region and abutting a portion of the collector contact region.

20. The semiconductor device of claim 19, wherein the substrate is further characterized as having a p-type conductivity.

21. The semiconductor device of claim 19, wherein the buried layer is further characterized as having a n-type conductivity.

22. The semiconductor device of claim 19, wherein the emitter region is further characterized as a polysilicon emitter.

23. A semiconductor device comprising:
    a substrate of a first conductivity type;
    a first buried layer of a second conductivity type lying within a first portion of the substrate;
    a second buried layer of the first conductivity type lying within a second portion of the substrate, and laterally offset from the first buried layer;
    a first doped region of the second conductivity type lying in between the first buried layer and the second buried layer, the first doped region abutting the first buried layer and the second buried layer;
    a second doped region of the first conductivity type overlying the first buried layer and the first doped region;
    a base region lying within a portion of the second doped region;
    an emitter region overlying the base region; and
    a collector contact region extending through the second doped region and electrically coupled to the first buried layer.

24. The semiconductor device of claim 23 further comprising a well region of the first conductivity type overlying the second buried layer.

25. The semiconductor device of claim 23, wherein the substrate is further characterized as having a p-type conductivity.

26. The semiconductor device of claim 23, wherein the first buried layer is further characterized as having a n-type conductivity.

27. The semiconductor device of claim 23 further comprising:
a resistor, the resistor having a first terminal and a second terminal, wherein the second terminal of the resistor abuts a portion of the collector contact region.

28. The semiconductor device of claim 23 further comprising:
a resistor lying within a portion of the second doped region and abutting a portion of the collector contact region.

29. The semiconductor device of claim 23 further comprising:
a collector region of the second conductivity type lying within the second doped region, the collector region having a top surface and a bottom surface wherein the top surface abuts the base region and the bottom surface abuts the first buried layer.

30. The semiconductor device of claim 23, wherein the emitter region is further characterized as a polysilicon emitter.

31. A semiconductor device comprising:
a substrate having p-type conductivity;
a buried layer having n-type conductivity lying within a portion of the substrate;
an epitaxial silicon layer having p-type conductivity overlying the buried layer;
a base region having p-type conductivity lying within a first portion of the epitaxial silicon layer;
a collector region having n-type conductivity lying within a second portion of the epitaxial silicon layer, the collector region having a top surface and a bottom surface wherein the top surface abuts the base region and the bottom surface abuts the buried layer;
a polysilicon emitter overlying the base region;
a collector contact region extending through a third portion of the epitaxial silicon layer and electrically coupled to the buried layer; and
a resistor lying within a fourth portion of the epitaxial silicon layer and abutting a portion of the collector contact region.

32. A semiconductor device comprising:
a substrate of a first conductivity type;
a first buried layer of a second conductivity type lying within the substrate;
a first region of the first conductivity type laterally offset from the first buried layer;
a second region of the second conductivity type lying between the first buried layer and the first region, wherein a first portion of the second region abuts the first buried layer and a second portion of the second region abuts the first region;
a third region of the first conductivity type overlying the first buried layer and the second region;
a base region lying within a portion of the third region;
an emitter region overlying the base region; and
a collector contact region extending through the third region and electrically coupled to the first buried layer.

33. The semiconductor device of claim 32 further comprising:
a resistor, the resistor having a first terminal and a second terminal wherein the second terminal of the resistor abuts a portion of the collector contact region.

34. The semiconductor device of claim 32 wherein the first region comprises a second buried layer.

35. The semiconductor device of claim 32 wherein the first region comprises a well region.

36. The semiconductor device of claim 35 wherein the first region further comprises a second buried layer under the well region.

37. The semiconductor device of claim 32 further comprising:
a collector region of the second conductivity type lying within the third region, the collector region having a top surface and a bottom surface wherein the top surface abuts the base region and the bottom surface abuts the first buried layer.

38. The semiconductor device of claim 32 further comprising:
a resistor lying within a portion of the third region and abutting a portion of the collector contact region.

* * * * *